(12) United States Patent
Lee

(10) Patent No.: US 8,140,041 B2
(45) Date of Patent: Mar. 20, 2012

(54) TUNABLE CAPACITIVE DEVICE WITH LINEARIZATION TECHNIQUE EMPLOYED THEREIN

(75) Inventor: Wen-Chang Lee, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 343 days.

(21) Appl. No.: 12/548,454

(22) Filed: Aug. 27, 2009

(65) Prior Publication Data

US 2011/0051311 A1   Mar. 3, 2011

(51) Int. Cl.
*H04B 1/06* (2006.01)
*H04B 7/00* (2006.01)

(52) U.S. Cl. ............ 455/262; 455/180.4; 327/586

(58) Field of Classification Search ............ 455/180.4, 455/262; 327/586
See application file for complete search history.

(56) References Cited

U.S. PATENT DOCUMENTS 4,368,541 A * 1/1983 Evans ................... 455/185.1
6,504,443 B1 * 1/2003 Eguizabal ................ 331/177 V

OTHER PUBLICATIONS

Lin, "A 1.4GHz Differential Low-Noise CMOS Frequency Synthesizer using a Wideband PLL Architecture," IEEE International Solid-State Circuits Conference, 2000.
Kuo, "A Spur-Reduction Technique for a 5-GHz Frequency Synthesizer," IEEE Transactions on Circuits and Systems-I:Regular Papers, vol. 53, No. 3, Mar. 2006.
Bonfanti, "A Varactor Configuration Minimizing the Amplitude-to-Phase Noise Conversion in VCOs," IEEE Transactions on Circuits and Systems-I: Regular Papers, vol. 53, No. 3, Mar. 2006.

* cited by examiner

*Primary Examiner* — Lincoln Donovan
*Assistant Examiner* — John Poos
(74) *Attorney, Agent, or Firm* — Winston Hsu; Scott Margo

(57) ABSTRACT

One exemplary tunable capacitive device includes a first tunable capacitive element, a first coupling capacitive element, a first coupling resistive element, and a first specific capacitive element. The first tunable capacitive element has a first node coupled to a first input voltage, and a second node. The first coupling capacitive element has a first node coupled to the second node of the first tunable capacitive element, and a second node coupled to a first connection terminal of the tunable capacitive device. The first coupling resistive element has a first node coupled to the second node of the first tunable capacitive element, and a second node coupled to a second input voltage, where the first input voltage and the second input voltage include a control voltage and a reference voltage. The first specific capacitive element is coupled between the first node and the second node of the first tunable capacitive element.

17 Claims, 12 Drawing Sheets

(A)

(B)

(A)

(B)

TUNABLE CAPACITIVE DEVICE WITH LINEARIZATION TECHNIQUE EMPLOYED THEREIN

BACKGROUND

The present invention relates to a tunable circuit component, and more particularly, to a tunable capacitive device with linearization technique employed therein for linearizing the capacitance-voltage (C-V) characteristic thereof.

Tunable capacitive devices, such as varactors, are commonly used in a variety of applications. For example, a voltage-controlled oscillator (VCO) has tunable capacitive devices implemented therein. Besides, the VCO is also a common circuit component used in a variety of applications. Taking a conventional VCO modulated transmitter architecture for example, a VCO-based modulator is used to modulate the baseband information to a radio-frequency (RF) carrier through a VCO control voltage. For instance, the information to be transmitted is applied to an input of a sigma-delta modulated synthesizer which enforces the VCO to follow the information to be transmitted.

One general implementation of the conventional VCO is to use an LC oscillator architecture which includes at least a fixed-value inductive element and at least a tunable capacitive element. Therefore, varying the capacitive value (capacitance value) of the implemented tunable capacitive element by setting the tunable control voltage will change the oscillation frequency of the VCO accordingly. In other words, the C-V characteristic of the tunable capacitive element affects the overall voltage-frequency (V-F) characteristic of the VCO. In a case where the C-V characteristic of the tunable capacitive element is nonlinear, the V-F characteristic of the VCO becomes nonlinear; however, the nonlinear V-F characteristic of the VCO causes the loop bandwidth of the aforementioned VCO modulated transmitter to change during modulation. If the loop bandwidth becomes too smaller, a signal distortion of the modulation output may occur, which degrades the modulation accuracy greatly.

Therefore, how to design a tunable capacitive element satisfying requirements of a designated application becomes an important issue to the designer.

SUMMARY OF THE INVENTION

In accordance with embodiments of the present invention, exemplary tunable capacitive devices with linearization technique employed therein are proposed.

According to a first aspect of the present invention, an exemplary tunable capacitive device is disclosed. The exemplary tunable capacitive device includes a first tunable capacitive element, a first coupling capacitive element, a first coupling resistive element, and a first specific capacitive element. The first tunable capacitive element has a first node and a second node, where the first node of the first tunable capacitive element is coupled to a first input voltage. The first coupling capacitive element has a first node and a second node, where the first node of the first coupling capacitive element is coupled to the second node of the first tunable capacitive element, and the second node of the first coupling capacitive element is coupled to a first connection terminal of the tunable capacitive device. The first coupling resistive element has a first node and a second node, where the first node of the first coupling resistive element is coupled to the second node of the first tunable capacitive element, the second node of the first coupling resistive element is coupled to a second input voltage, one of the first input voltage and the second input voltage is a control voltage configured for tuning a capacitive value of the tunable capacitive device, and the other of the first input voltage and the second input voltage is a reference voltage. The first specific capacitive element is coupled between the first node and the second node of the first tunable capacitive element.

According to a second aspect of the present invention, an exemplary tunable capacitive device is disclosed. The exemplary tunable capacitive device includes a first tunable capacitive element, a second tunable capacitive element, a first coupling capacitive element, a second coupling capacitive element, a first coupling resistive element, a second coupling resistive element, and a specific capacitive element. The first tunable capacitive element has a first node and a second node, where the first node of the first tunable capacitive element is coupled to a first input voltage. The second tunable capacitive element has a first node and a second node, where the first node of the second tunable capacitive element is coupled to the first input voltage. The first coupling capacitive element has a first node and a second node, where the first node of the first coupling capacitive element is coupled to the second node of the first tunable capacitive element, and the second node of the first coupling capacitive element is coupled to a first connection terminal of the tunable capacitive device. The second coupling capacitive element has a first node and a second node, where the first node of the second coupling capacitive element is coupled to the second node of the second tunable capacitive element, and the second node of the second coupling capacitive element is coupled to a second connection terminal of the tunable capacitive device. The first coupling resistive element has a first node and a second node, where the first node of the first coupling resistive element is coupled to the second node of the first tunable capacitive element, and the second node of the first coupling resistive element is coupled to a second input voltage. The second coupling resistive element has a first node and a second node, where the first node of the second coupling resistive element is coupled to the second node of the second tunable capacitive element, the second node of the second coupling resistive element is coupled to the second input voltage, one of the first input voltage and the second input voltage is a control voltage configured for tuning a capacitive value of the tunable capacitive device, and the other of the first input voltage and the second input voltage is a reference voltage. The specific capacitive element is coupled between the second node of the first tunable capacitive element and the second node of the second tunable capacitive element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
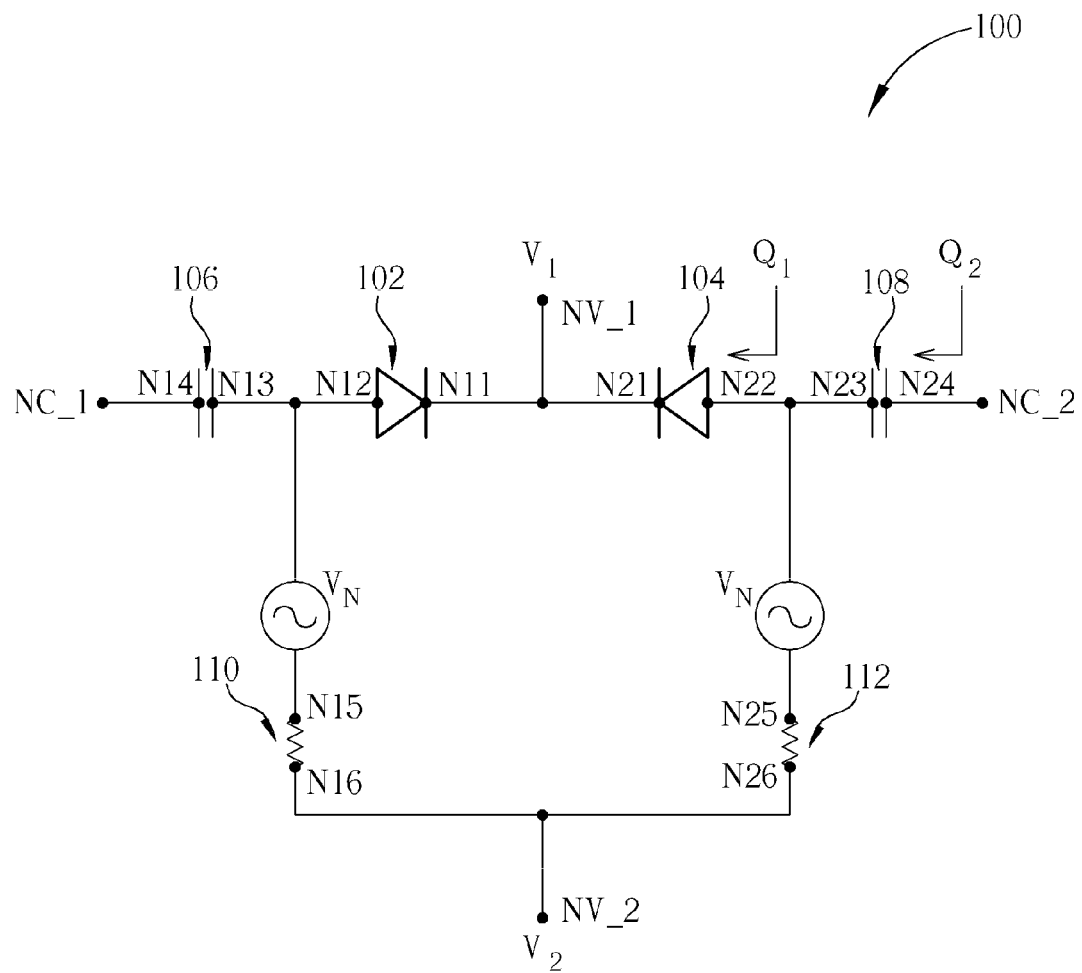
FIG. 1 is a diagram illustrating a tunable capacitive device according to a first exemplary embodiment of the present invention.

FIG. 1 is a diagram illustrating a tunable capacitive device 100 according to a first exemplary embodiment of the present invention. The tunable capacitive device (e.g., a varactor device) 100 includes a first tunable capacitive element 102, a second tunable capacitive element 104, a first coupling capacitive element (e.g., a coupling capacitor) 106, a second coupling capacitive element (e.g., a coupling capacitor) 108, a first coupling resistive element (e.g., a coupling resistor) 110, and a second coupling resistive element (e.g., a coupling resistor) 112. The first tunable capacitive element 102 has a first node N11 and a second node N12, where the first node N11 is coupled to a first voltage input terminal NV_1 configured to receive a first input voltage $V_1$. The first coupling capacitive element 106 has a first node N13 and a second node N14, where the first node N13 is coupled to the second node N12 of the first tunable capacitive element 102, and the second node N14 is coupled to a first connection terminal NC_1 of the tunable capacitive device 100. The first coupling resistive element 110 has a first node N15 and a second node N16, where the first node N15 is coupled to the second node N12 of the first tunable capacitive element 102, and the second node N16 is coupled to a second voltage input terminal NV_2 configured to receive a second input voltage $V_2$. It should be noted that one of the first input voltage $V_1$ and the second input voltage $V_2$ serves as a control voltage configured for tuning a capacitive value (capacitance value) of the tunable capacitive device 100, and the other of the first input voltage $V_1$ and the second input voltage $V_2$ therefore serves as a fixed reference voltage. More specifically, in one exemplary design, the first input voltage $V_1$ is configured to be the control voltage, and the second input voltage $V_2$ is configured to be the reference voltage; in another exemplary design, the first input voltage $V_1$ is configured to be the reference voltage, and the second input voltage $V_2$ is configured to be the control voltage. The setting of the first input voltage $V_1$ and the second input voltage $V_2$ depends on actual design requirements.

The tunable capacitive device 100 shown in FIG. 1 is implemented using a differential topology to meet the requirements of a differential application. Therefore, the tunable capacitive device 100 also has the second tunable capacitive element 104, the second coupling capacitive element 108, and the second coupling resistive element 112 included therein. As shown in FIG. 1, the second tunable capacitive element 104 has a first node N21 and a second node N22, where the first node N21 is coupled to the first voltage input terminal NV_1; the second coupling capacitive element 108 has a first node N23 and a second node N24, where the first node N23 is coupled to the second node N22 of the second tunable capacitive element 104, and the second node N24 is coupled to a second connection terminal NC_2 of the tunable capacitive device 100; and the second coupling resistive element 112 has a first node N25 and a second node N26, where the first node N25 is coupled to the second node N22 of the second tunable capacitive element 104, and the second node N26 is coupled to the second voltage input terminal NV_2.

The first voltage input terminal NV_1 and the second voltage input terminal NV_2 are used for supplying voltages to the tunable capacitive device 100 to control the capacitive value (capacitance value) of the tunable capacitive device 100. In this exemplary embodiment, each of the first coupling capacitive element 106 and the second coupling capacitive element 108 is for AC coupling, and each of the first connection terminal NC_1 and the second connection terminal NC_2 has an interconnection with other circuit part of an application circuit (e.g., a VCO) which employs the tunable capacitive device 100.

Please note that the tunable capacitive device can also be implemented using a single-ended topology to meet the requirements of a single-ended application. In such an alternative design, the second tunable capacitive element 104, the second coupling capacitive element 108, and the second coupling resistive element 112 as shown in FIG. 1 are omitted.

By way of example, but not limitation, the tunable capacitive device 100 shown in FIG. 1 is employed in a VCO-based modulator of a VCO modulated transmitter. Therefore, the large-signal C-V characteristic looking from the VCO must follow the specification of the VCO gain $K_{VCO}$. The thermal noise $V_N$ resulted from each of the first and second coupling resistive elements 110 and 112 would cause undesired phase noise around the carrier frequency. For a given bandwidth $\Delta f$, the thermal noise $V_N$ can be expressed as follows:

$$V_N = \sqrt{\overline{v_n^2}} = \sqrt{4kTR\Delta f} \qquad (1)$$

In above equation (1), $\overline{v_n^2}$ represents the voltage variance (mean square), k represents the Boltzmann's constant, T is the absolute temperature, and R is the resistive value. Besides, the VCO modulated transmitter's noise resulted from the thermal noise $V_N$ is in proportion to the VCO gain $K_{VCO}$. To alleviate the undesired thermal noise $V_N$, the resistive value R of the coupling resistive element (e.g., 110 or 112) should be set by a small value. However, given Q1 and Q2 are larger than 5, the Q factor Q1 and the Q factor Q2 have following characteristics:

$$Q_1 \propto \Omega * R * C_{var} \quad (2)$$

$$Q_2 = Q_1 * \frac{(C_{mom} + C_{var})}{C_{mom}} \quad (3)$$

$C_{var}$ represents the capacitive value of the tunable capacitive element (e.g., 102 or 104), $C_{mom}$ represents the capacitive value of the coupling capacitive element (e.g., 106 or 108), and $\Omega$ represents the angular frequency.

When the resistive value R of the coupling resistive element is reduced to alleviate the thermal noise, the ratio $$\frac{C_{var}}{C_{mom}}$$

has to be increased to keep the Q factor Q2 at a desired value. Preferably, the Q factor Q2 should be maintained at a large value to keep the Q factor of the VCO. However, the increase of the ratio $$\frac{C_{var}}{C_{mom}}$$

leads to a smaller internal swing across the tunable capacitive element. Accordingly, a less linear C-V characteristic is possessed by the tunable capacitive device due to the smaller internal swing. In addition, the increase of the ratio $$\frac{C_{var}}{C_{mom}}$$

would also make the VCO gain $K_{VCO}$ smaller, thus obtaining a wider transition region in small signal C-V curve. In other words, intention to make the Q factor better contradicts the $K_{VCO}$ linearity. Therefore, each of the VCO gain $K_{VCO}$, the Q factor Q2, and the linearity is a function of the ratio $$\frac{C_{var}}{C_{mom}}.$$

To achieve linearity and high Q factor simultaneously, at least one additional capacitive element is therefore particularly added to the tunable capacitive device 100. In the following, a plurality of improved circuit designs based on the circuit architecture shown in FIG. 1 are disclosed.

Figure 2:
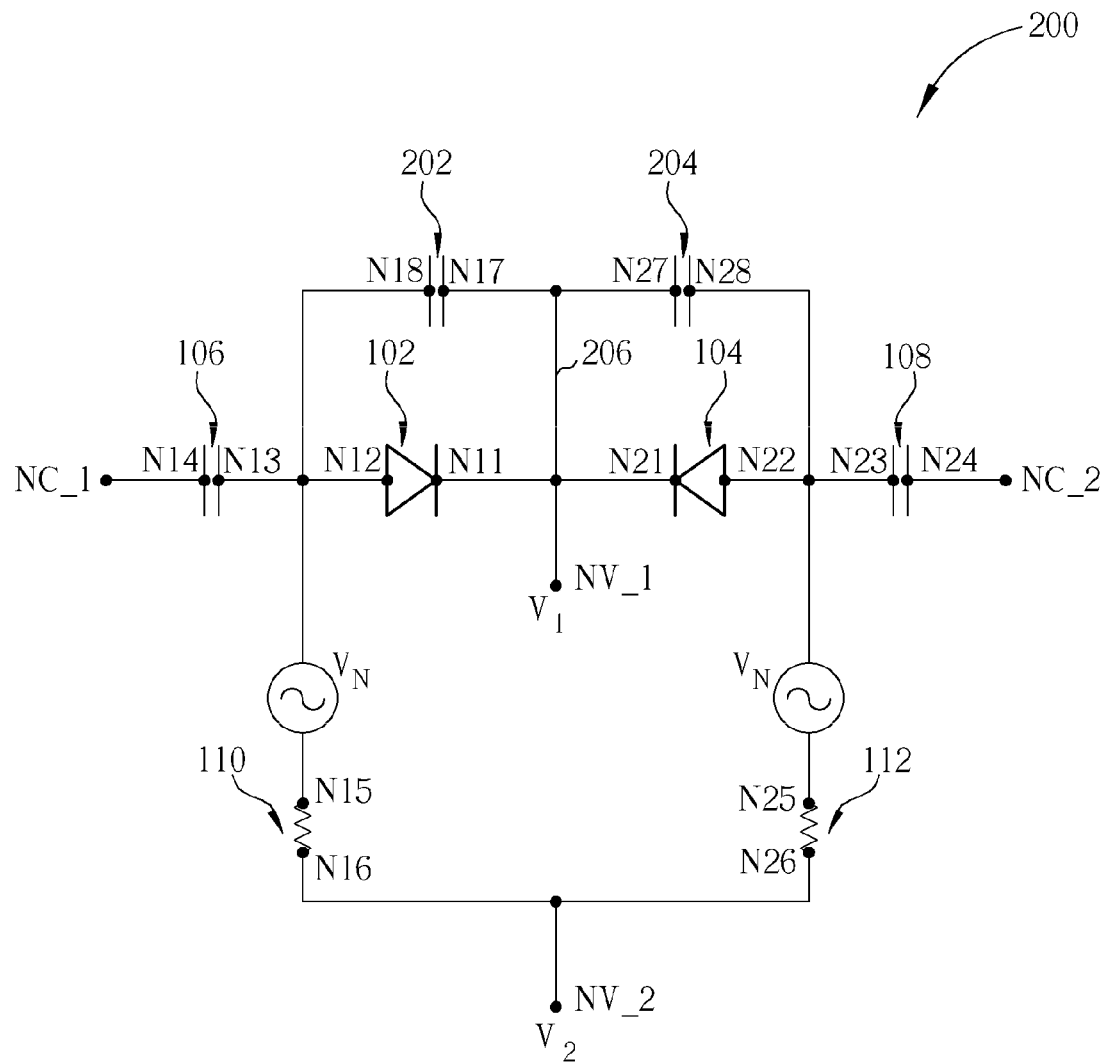
FIG. 2 is a diagram illustrating a tunable capacitive device according to a second exemplary embodiment of the present invention.

FIG. 2 is a diagram illustrating a tunable capacitive device 200 according to a second exemplary embodiment of the present invention. In addition to the first tunable capacitive element 102, the second tunable capacitive element 104, the first coupling capacitive element 106, the second coupling capacitive element 108, the first coupling resistive element 110, and the second coupling resistive element 112 as shown in FIG. 1, the tunable capacitive device (e.g., a varactor device) 200 includes a first specific capacitive element (e.g., a capacitor) 202 having a first node N17 and a second node N18 respectively coupled to the first node N11 and the second node N12 of the first tunable capacitive element 102, and a second specific capacitive element (e.g., a capacitor) 204 having a first node N27 and a second node N28 respectively coupled to the first node N21 and the second node N22 of the second tunable capacitive element 104.

Figure 3:
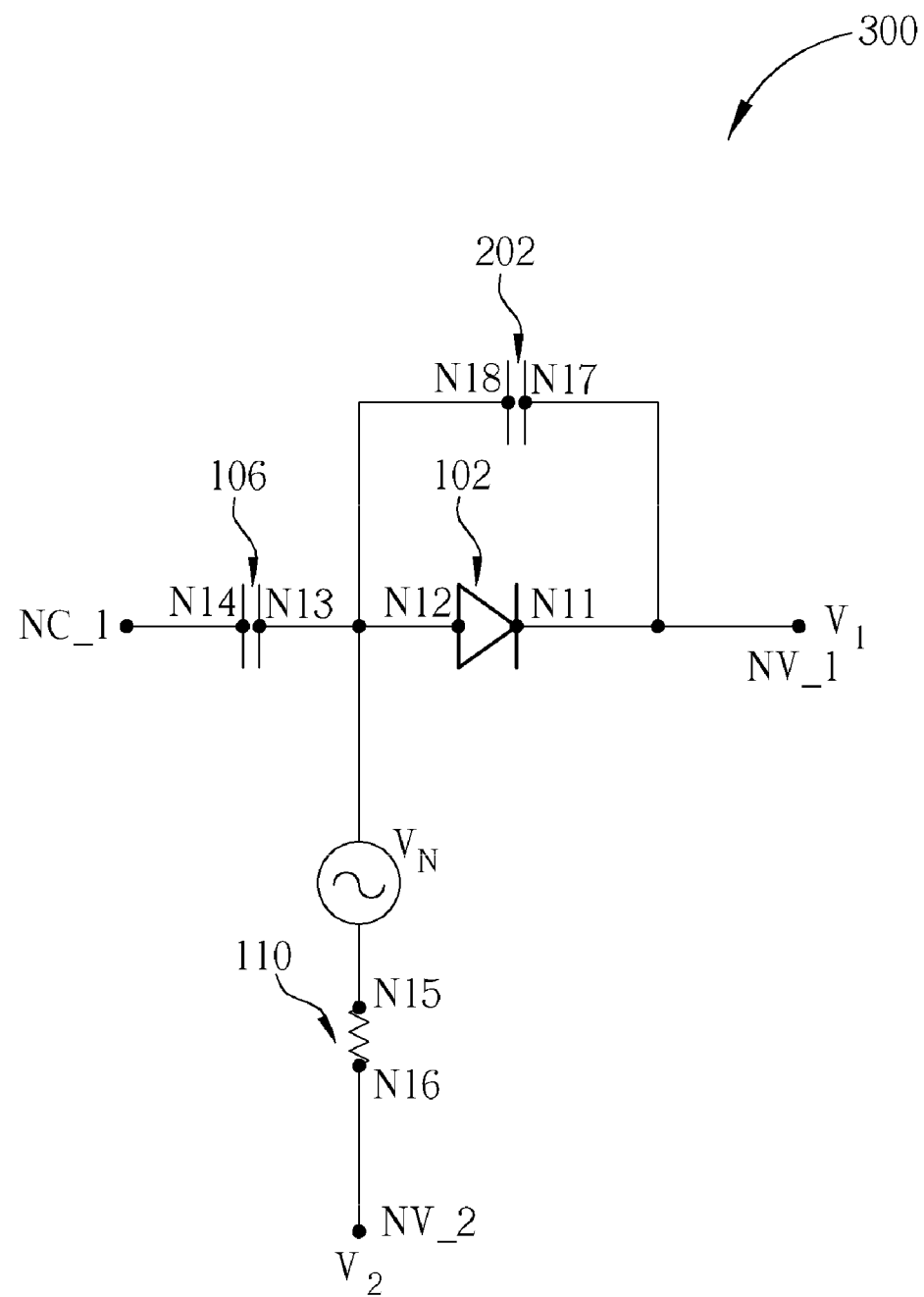
FIG. 3 is a diagram illustrating a tunable capacitive device according to a third exemplary embodiment of the present invention.

The exemplary tunable capacitive device 200 shown in FIG. 2 is implemented using a differential topology to meet the requirements of a differential application. However, the tunable capacitive device can also be implemented using a single-ended topology to meet the requirements of a single-ended application. Please refer to FIG. 3, which is a diagram illustrating a tunable capacitive device 300 according to a third exemplary embodiment of the present invention. In such an alternative design shown in FIG. 3, the second tunable capacitive element 104, the second coupling capacitive element 108, the second coupling resistive element 112, and the second specific capacitive element 204 as shown in FIG. 2 are omitted.

A comparison between the tunable capacitive device 200 shown in FIG. 2 and the tunable capacitive device 100 shown in FIG. 1 is detailed as follows.

Figure 4:
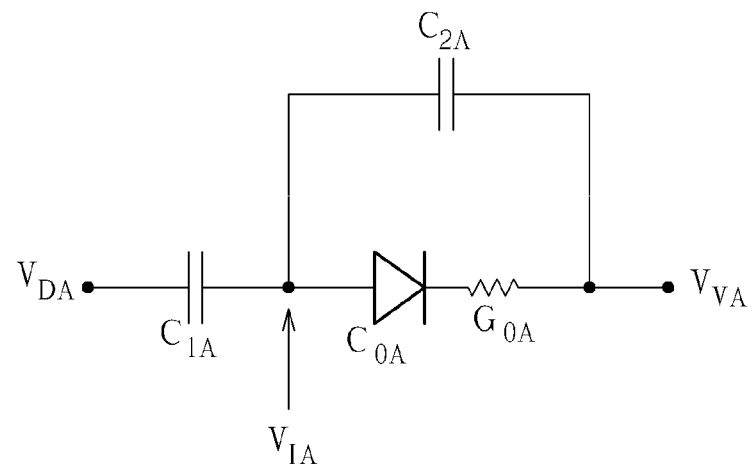
FIG. 4 shows representative circuit models of parts of the tunable capacitive device shown in FIG. 2 and the tunable capacitive device shown in FIG. 3.
Figure 4:
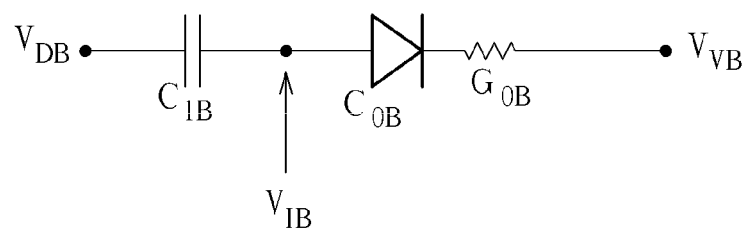

FIG. 4 shows a representative circuit model of part of the tunable capacitive device 200 and a representative circuit model of part of the tunable capacitive device 100. As shown in the sub-diagram (A) in FIG. 4, the first tunable capacitive element 102 in the tunable capacitive device 200 has a capacitive value $C_{0A}$, the first coupling capacitive element 106 in the tunable capacitive device 200 has a capacitive value $C_{1A}$, the first specific capacitive element 202 in the tunable capacitive device 200 has a capacitive value $C_{2A}$, the conductance is represented by $G_{0A}$, the voltage level at the first connection terminal NC_1 is $V_{DA}$, the voltage level at the second node of the first tunable capacitive element 102 is $V_{IA}$, and the voltage level at the first voltage input terminal NV_1 is $V_{VA}$. As shown in the sub-diagram (B) in FIG. 4, the first tunable capacitive element 102 in the tunable capacitive device 100 has a capacitive value $C_{0B}$, the first coupling capacitive element 106 in the tunable capacitive device 100 has a capacitive value $C_{1B}$, the conductance is represented by $G_{0B}$, the voltage level at the first connection terminal NC_1 is $V_{DB}$, the voltage level at the second node of the first tunable capacitive element 102 is $V_{IB}$, and the voltage level at the first voltage input terminal NV_1 is $V_{VB}$.

The internal swing $V_{IA}$ of the tunable capacitive device 200 and the internal swing $V_{IB}$ of the tunable capacitive device 100 can be expressed using following equations.

$$V_{IA} = V_{DA} \cdot \frac{C_{1A}}{C_{1A} + C_{0A} + C_{2A}} \quad (4)$$

$$V_{IB} = V_{DB} \cdot \frac{C_{1B}}{C_{1B} + C_{0B}} \quad (5)$$

The equivalent capacitive value $C_{EA}$ of the tunable capacitive device 200 and the equivalent capacitive value $C_{EB}$ of the tunable capacitive device 100 can be expressed using following equations.

$$C_{EA} = \frac{C_{1A} \cdot (C_{0A} + C_{2A})}{C_{1A} + C_{0A} + C_{2A}} \quad (6)$$

$$C_{EB} = \frac{C_{1B} \cdot C_{0B}}{C_{1B} + C_{0B}} \quad (7)$$

With regard to the tunable capacitive device 200, the tuning sensitivity (i.e., the VCO gain) $K_{VA}$ can be derived using following equations.

$$\frac{\partial C_{EA}}{\partial C_{0A}} = \left(\frac{C_{1A}}{C_{1A} + C_{0A} + C_{2A}}\right)^2 \quad (8)$$

$$\frac{\partial C_{0A}}{\partial V} = k_c \cdot C_{0A} \quad (9)$$

$$\frac{\partial C_{EA}}{\partial V} = \frac{\partial C_{EA}}{\partial C_{0A}} \cdot \frac{\partial C_{0A}}{\partial V} = \left(\frac{C_{1A}}{C_{1A} + C_{0A} + C_{2A}}\right)^2 \cdot k_c \cdot C_{0A} \quad (10)$$

$$K_{VA} = \frac{\partial f}{\partial V} \quad (11)$$
$$= -\frac{f_{osc}}{2C_T} \cdot \frac{\partial C_{EA}}{\partial V}$$
$$= -\frac{f_{osc}}{2C_T} \cdot \left(\frac{C_{1A}}{C_{1A} + C_{0A} + C_{2A}}\right)^2 \cdot k_c \cdot C_{0A}$$

With regard to the tunable capacitive device 100, the tuning sensitivity (i.e., the VCO gain) $K_{VB}$ can be derived using following equations.

$$\frac{\partial C_{EB}}{\partial C_{0B}} = \left(\frac{C_{1B}}{C_{1B} + C_{0B}}\right)^2 \quad (12)$$

$$\frac{\partial C_{0B}}{\partial V} = k_c \cdot C_{0B} \quad (13)$$

$$\frac{\partial C_{EB}}{\partial V} = \frac{\partial C_{EB}}{\partial C_{0B}} \cdot \frac{\partial C_{0B}}{\partial V} = \left(\frac{C_{1B}}{C_{1B} + C_{0B}}\right)^2 \cdot k_c \cdot C_{0B} \quad (14)$$

$$K_{VB} = \frac{\partial f}{\partial V} \quad (15)$$
$$= -\frac{f_{osc}}{2C_T} \cdot \frac{\partial C_{EB}}{\partial V}$$
$$= -\frac{f_{osc}}{2C_T} \cdot \left(\frac{C_{1B}}{C_{1B} + C_{0B} + C_{2B}}\right)^2 \cdot k_c \cdot C_{0B}$$

Please note that $C_T$ represents the total capacitive value, $f_{osc}$ represent the oscillation frequency of the VCO, and $k_c$ is a semiconductor process parameter.

If the same tuning sensitivity is desired, the condition $K_{VA} = K_{VB}$ has to be satisfied, leading to the following equation.

$$\left(\frac{C_{1A}}{C_{1A} + C_{0A} + C_{2A}}\right)^2 \cdot C_{0A} = \left(\frac{C_{1B}}{C_{1B} + C_{0B}}\right)^2 \cdot C_{0B} \quad (16)$$

In addition, if the same internal swing is also desired, the condition $V_{IA} = V_{IB}$ with $V_{DA} = V_{DB}$ has to be satisfied, leading to the following equation.

$$\frac{C_{1A}}{C_{1A} + C_{0A} + C_{2A}} = \frac{C_{1B}}{C_{1B} + C_{0B}} \quad (17)$$

Based on the above equations (16) and (17), the following equations are easily derived:

$$C_{0A} = C_{0B} \quad (18)$$

$$C_{1B} = C_{1A} \cdot \left(\frac{C_{0A}}{C_{0A} + C_{2A}}\right) \quad (19)$$

Therefore, in order to have the tuning sensitivity and the internal swing identical to that possessed by the tunable capacitive device 200, the capacitive value of the first coupling capacitive element 106 in the tunable capacitive device 100 has to be scaled down and the capacitive value of the first tunable capacitive element 102 in the tunable capacitive device 100 should be kept unchanged. In addition, the equivalent capacitive value looking into the circuit shown in the sub-diagram (B) in FIG. 4 can be expressed using the following equation.

$$C_{EB} = \left(\frac{C_{0A}}{C_{2A} + C_{0A}}\right) \cdot C_{EA} \quad (20)$$

In view of above, the circuit shown in the sub-diagram (B) in FIG. 4 which corresponds to the tunable capacitive device 100 is less capacitive than the circuit shown in the sub-diagram (A) in FIG. 4 which corresponds to the tunable capacitive device 200.

Moreover, the equivalent conductance $G_{EA}$ of the tunable capacitive device 200 and the equivalent conductance $G_{EB}$ of the tunable capacitive device 100 can be expressed using following equations.

$$G_{EA} = \left(\frac{C_{1A} \cdot C_{0A}}{C_{1A} + C_{0A} + C_{2A}}\right)^2 \cdot \frac{1}{G_{0A}} \quad (21)$$

$$G_{EB} = \left(\frac{C_{1B} \cdot C_{0B}}{C_{1B} + C_{0B}}\right)^2 \cdot \frac{1}{G_{0B}} \quad (22)$$

In view of the equations mentioned above, it is readily known that the equivalent conductance $G_{EA}$ is equal to the equivalent conductance $G_{EB}$, if $G_{OA} = G_{OB}$.

It should be noted that the value of the Q factor depends upon the equivalent conductance $C_{EA}/C_{EB}$ and the equivalent capacitive value $G_{EA}/G_{EB}$. Therefore, the tunable capacitive device 200 shown in FIG. 2 is better than the tunable capacitive device 100 shown in FIG. 1 in terms of Q.

The design rule of the tunable capacitive device 200, 300 is briefly summarized as follows: choosing the resistive value of the coupling resistive element according to the noise consideration, where the resistive value is preferably small; adding a specific capacitive element in parallel with the tunable capacitive element to boost the Q factor Q1, where the capacitive value of the particularly added capacitive element should be large enough to have such a Q factor boosting effect; sizing the coupling capacitive element to provide sufficiently large swing across the tunable capacitive element; and sizing the tunable capacitive element and the particularly added capacitive element to satisfy the VCO gain requirement.

Figure 5:
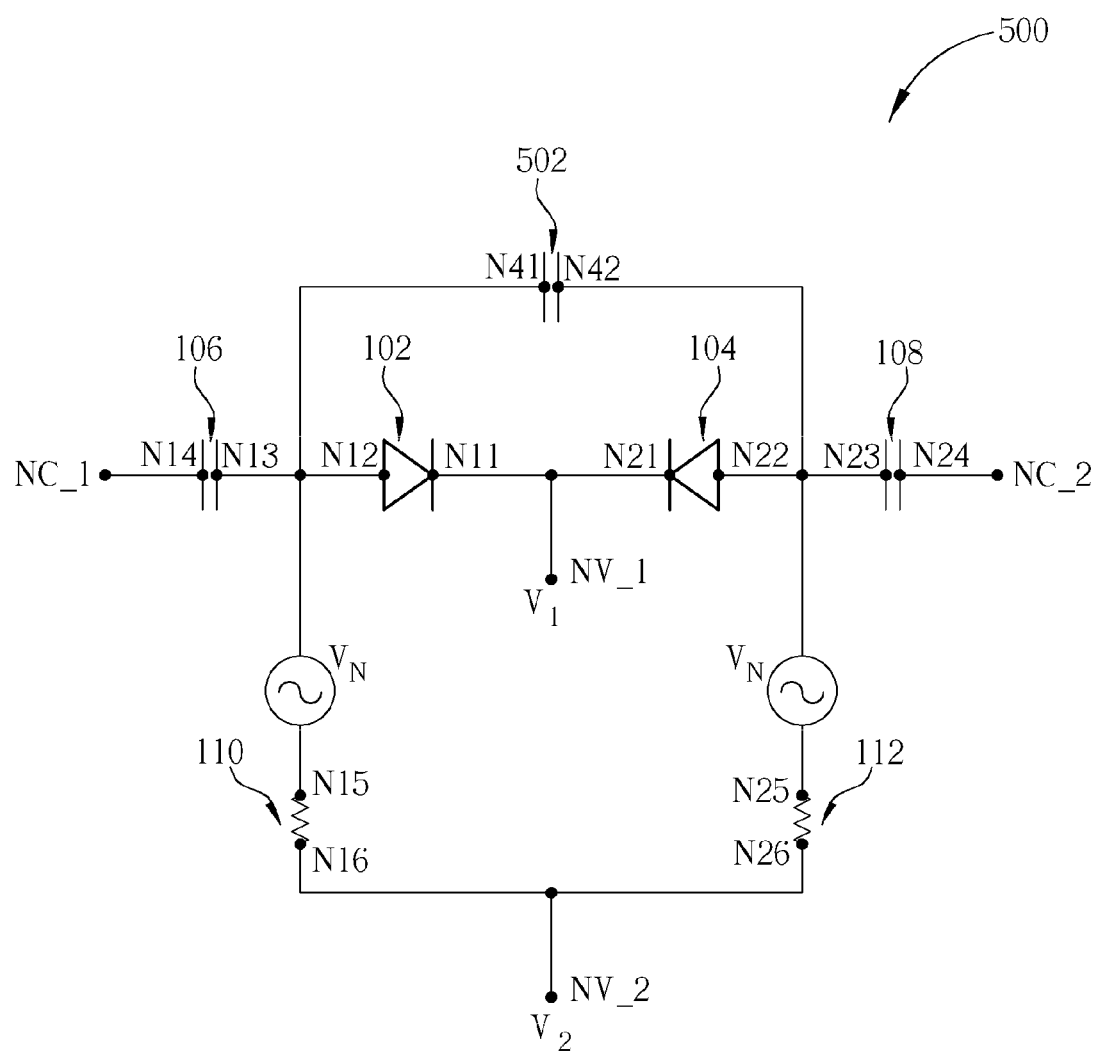
FIG. 5 is a diagram illustrating a tunable capacitive device according to a fourth exemplary embodiment of the present invention.

When common-mode signal components (e.g., even-order signal components of the VCO) are critical to performance of certain applications, the tunable capacitive device 200 with a connection 206 to guide the undesired signal components is preferred. However, regarding other applications with negligible effect caused by the common-mode signal components, the connection 206 can be omitted. Please refer to FIG. 5, which is a diagram illustrating a tunable capacitive device 500 according to a fourth exemplary embodiment of the present invention. In addition to the first tunable capacitive element 102, the second tunable capacitive element 104, the first coupling capacitive element 106, the second coupling capacitive element 108, the first coupling resistive element 110, and the second coupling resistive element 112 as shown in FIG. 1, the tunable capacitive device (e.g., a varactor device) 500 includes a specific capacitive element (e.g., a capacitor) 502 having a first node N41 and a second node N42 respectively coupled to the second node N12 of the first tunable capacitive element 102 and the second node N22 of the second tunable capacitive element 104.

In aforementioned exemplary embodiments, one end of the particularly added capacitive element (e.g., 202, 204, or 502) is terminated at one node of the tunable capacitive element (e.g., 102 or 104). However, this is for illustrative purposes only. That is, other alternative designs are feasible. Please refer to FIG. 6, which is a diagram illustrating a tunable capacitive device 600 according to a fifth exemplary embodiment of the present invention. In addition to the first tunable capacitive element 102, the second tunable capacitive element 104, the first coupling capacitive element 106, the second coupling capacitive element 108, the first coupling resistive element 110, and the second coupling resistive element 112 as shown in FIG. 1, the tunable capacitive device (e.g., a varactor device) 600 includes a first specific capacitive element (e.g., a capacitor) 602 having a first node N61 and a second node N62 respectively coupled to the first node N11 of the first tunable capacitive element 102 and the second node N14 of the first coupling capacitive element 106, and a second specific capacitive element (e.g., a capacitor) 604 having a first node N71 and a second node N72 respectively coupled to the first node N21 of the second tunable capacitive element 104 and the second node N24 of the second coupling capacitive element 108.

Figure 6:
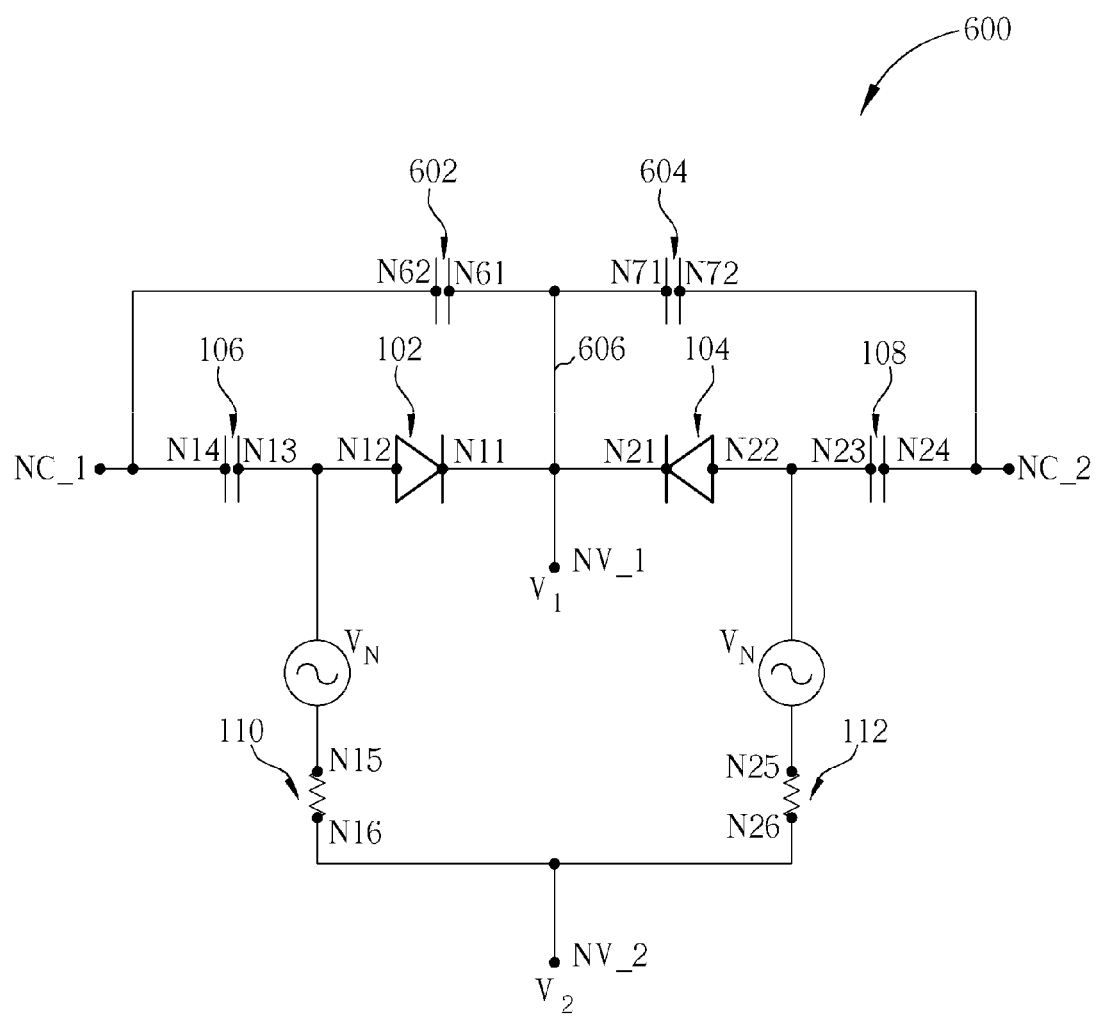
FIG. 6 is a diagram illustrating a tunable capacitive device according to a fifth exemplary embodiment of the present invention.
Figure 7:
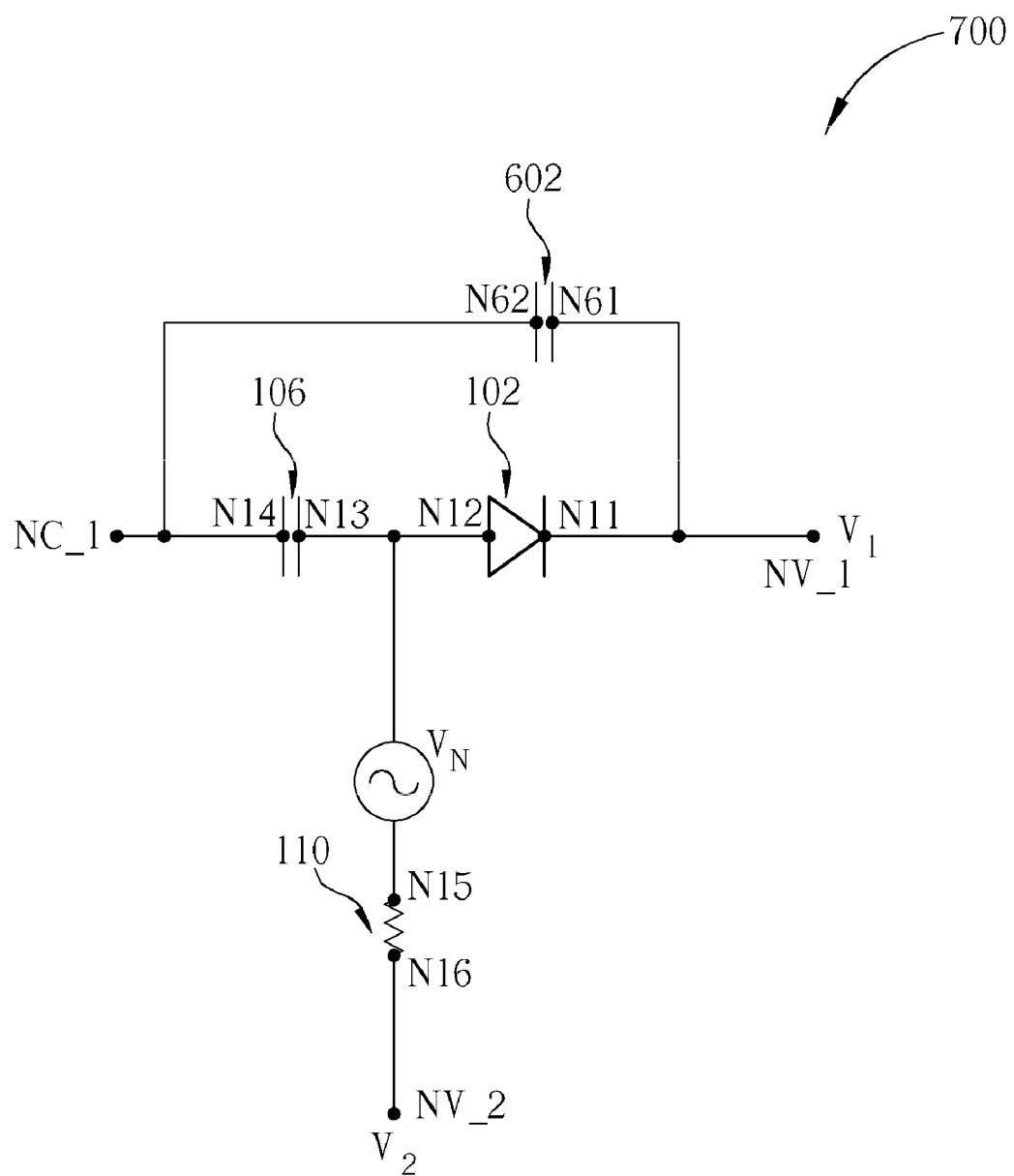
FIG. 7 is a diagram illustrating a tunable capacitive device according to a sixth exemplary embodiment of the present invention.

The exemplary tunable capacitive device 600 shown in FIG. 6 is implemented using a differential topology to meet the requirements of a differential application. However, the tunable capacitive device can also be implemented using a single-ended topology to meet the requirements of a single-ended application. Please refer to FIG. 7, which is a diagram illustrating a tunable capacitive device 700 according to a sixth exemplary embodiment of the present invention. In such an alternative design shown in FIG. 7, the second tunable capacitive element 104, the second coupling capacitive element 108, the second coupling resistive element 112, and the second specific capacitive element 604 as shown in FIG. 6 are omitted.

A comparison between the tunable capacitive device 200 shown in FIG. 2 and the tunable capacitive device 600 shown in FIG. 6 is detailed as follows.

Figure 8:
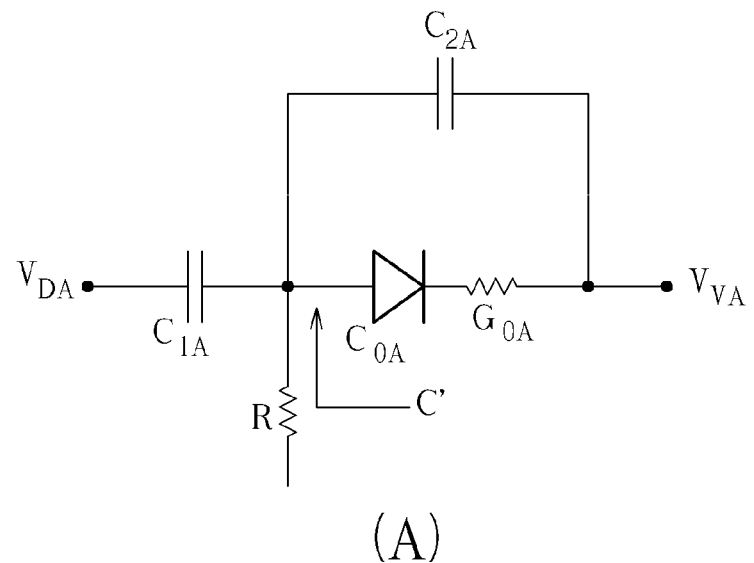
FIG. 8 shows representative circuit models of parts of the tunable capacitive device shown in FIG. 2 and the tunable capacitive device shown in FIG. 6.
Figure 8:
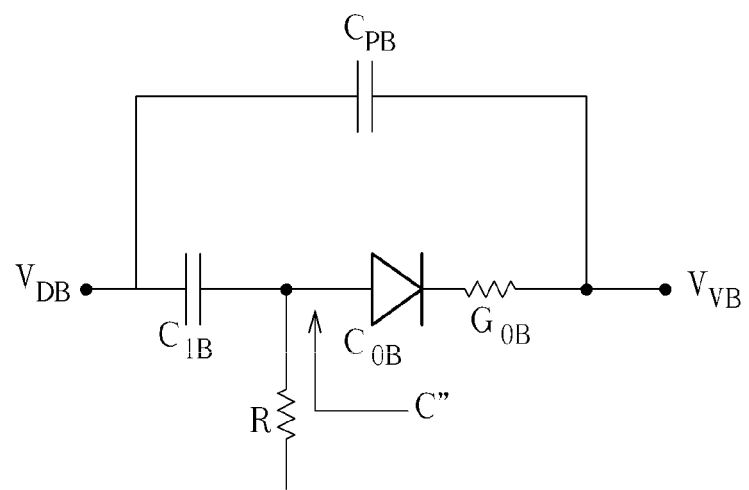

FIG. 8 shows a representative circuit model of part of the tunable capacitive device 200 and a representative circuit model of part of the tunable capacitive device 600. As shown in the sub-diagram (A) in FIG. 8, the first tunable capacitive element 102 in the tunable capacitive device 200 has a capacitive value $C_{0A}$, the first coupling capacitive element 106 in the tunable capacitive device 200 has a capacitive value $C_{1A}$, the first specific capacitive element 202 in the tunable capacitive device 200 has a capacitive value $C_{2A}$, the conductance is represented by $G_{0A}$, the resistive value of the first coupling resistive element 110 in the tunable capacitive device 200 is represented by R, the voltage level at the first connection terminal NC_1 is $V_{DA}$, and the voltage level at the first voltage input terminal NV_1 is $V_{VA}$. As shown in the sub-diagram (B) in FIG. 8, the first tunable capacitive element 102 in the tunable capacitive device 600 has a capacitive value $C_{0B}$, the first coupling capacitive element 106 in the tunable capacitive device 600 has a capacitive value $C_{1B}$, the first specific capacitive element 602 in the tunable capacitive device 600 has a capacitive value $C_{PB}$, the conductance is represented by $G_{0B}$, the resistive value of the first coupling resistive element 110 in the tunable capacitive device 600 is represented by R, the voltage level at the first connection terminal NC_1 is $V_{DB}$, and the voltage level at the first voltage input terminal NV_1 is $V_{VB}$. Provided that the first coupling resistive element 110 with the resistive value R is not taken into consideration, the circuit in the sub-diagram (B) of FIG. 8 is equivalent to the circuit in the sub-diagram (A) of FIG. 8 when the following conditions (equations) are satisfied.

$$C_{0A} = C_{0B} \quad (23)$$

$$G_{0A} = G_{0B} \quad (24)$$

$$C_{1B} = C_{1A} \cdot \left(\frac{C_{0A}}{C_{0A} + C_{2A}}\right) \quad (25)$$

$$C_{PB} = \left(\frac{C_{2A}}{C_{2A} + C_{0A}}\right) \cdot C_{EA} \quad (26)$$

Even though above conditions (equations) are satisfied, the noise performance differs when the first coupling resistive element 110 with the resistive value R is considered. The combination of the capacitive elements and the resistive element acts as a low-pass filter. In addition, as mentioned above, the thermal noise results from the coupling resistive element. Therefore, after reviewing the disclosed circuit models shown in FIG. 8, a person skilled in the art would readily appreciate that the equivalent capacitive value C' viewed by the noise source (i.e., the coupling resistive element) in the sub-diagram (A) of FIG. 8 is larger than the equivalent capacitive value C" viewed by the noise source (i.e., the coupling resistive element) in the sub-diagram (B) of FIG. 8. Since the cutoff frequency of the low-pass filter is in an inverse proportion to the equivalent capacitive value viewed by the coupling resistive element, the tunable capacitive devices 200 shown in FIG. 2 can reject more noise interference due to lower cutoff frequency. More specification, compared to the tunable capacitive devices 100 shown in FIG. 1, the tunable capacitive devices 200 and 600 both have better linearity and higher Q factor; additionally, compared to the tunable capacitive devices 600 shown in FIG. 6, the tunable capacitive device 200 provides better rejection to broadband noise.

Figure 9:
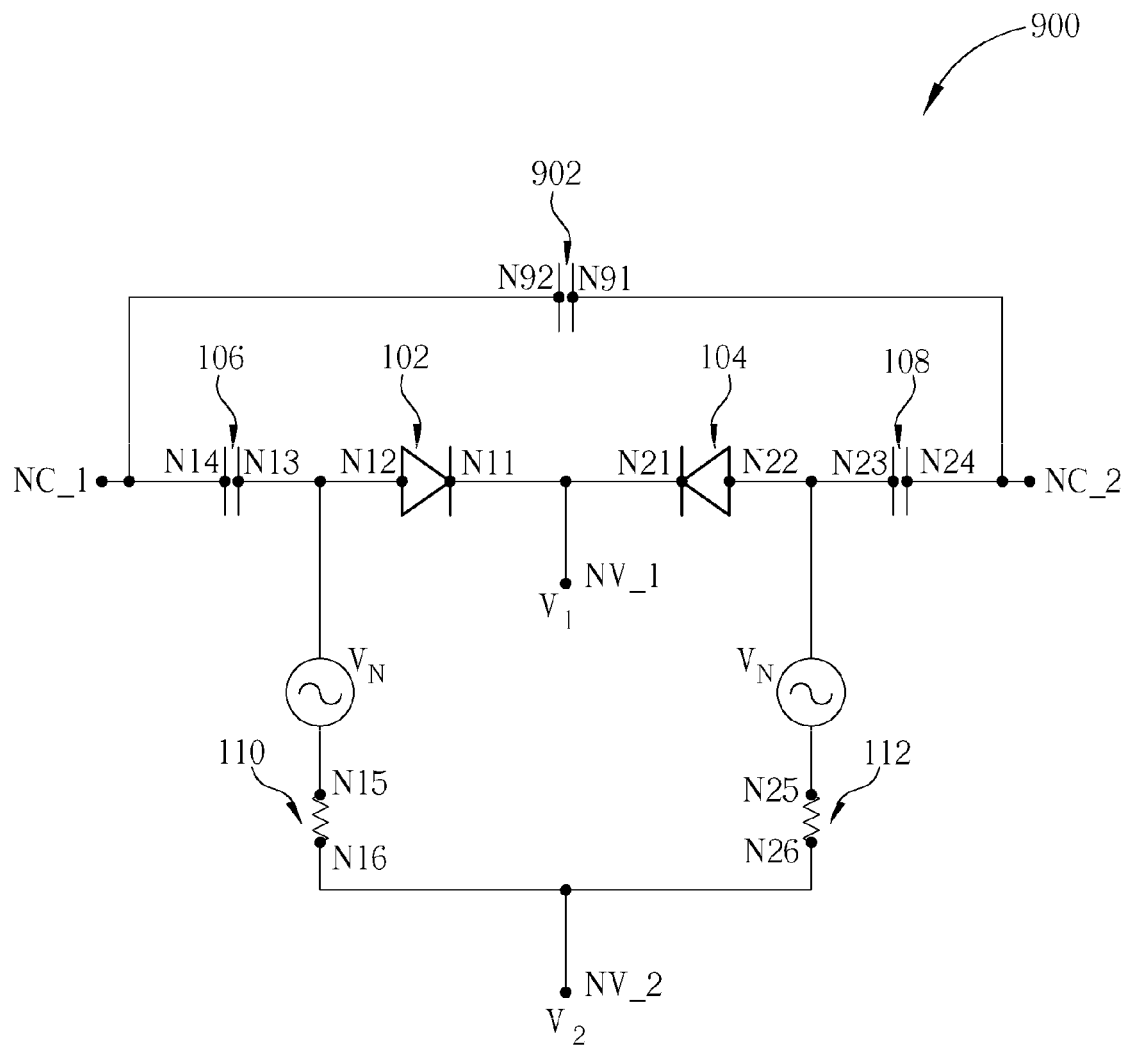
FIG. 9 is a diagram illustrating a tunable capacitive device according to a seventh exemplary embodiment of the present invention.

Similarly, when common-mode signal components (e.g., even-order signal components of the VCO) are critical to performance of certain applications, the tunable capacitive device 600 with a connection 606 to guide the undesired signal components is preferred. However, regarding other applications with negligible effect caused by the common-mode signal components, the connection 606 can be omitted. Please refer to FIG. 9, which is a diagram illustrating a tunable capacitive device 900 according to a seventh exemplary embodiment of the present invention. In addition to the first tunable capacitive element 102, the second tunable capacitive element 104, the first coupling capacitive element 106, the second coupling capacitive element 108, the first coupling resistive element 110, and the second coupling resistive element 112 as shown in FIG. 1, the tunable capacitive device (e.g., a varactor device) 900 includes a specific capacitive element (e.g., a capacitor) 902 having a first node N91 and a second node N92 respectively coupled to the second node N24 of the second coupling capacitive element 108 and the second node N14 of the first coupling capacitive element 106.

In aforementioned exemplary embodiments, the particularly added capacitive elements (i.e., 202, 204, 502, 602, 604, and 902) are used to improve linearity of the C-V characteristic of the tunable capacitive devices 200, 300, 500, 600, 700, and 900, and each of the tunable capacitive devices 200, 300, 500, 600, 700, and 900 requires a single reference voltage and a single control voltage to set its capacitive value (capacitance value). However, using more than one reference voltage/control voltage to tune the capacitive value (capacitance value) of a tunable capacitive device with a capacitive element particularly added for linearity improvement of the C-V characteristic still obeys the spirit of the present invention. Please refer to FIG. 10, which is a diagram illustrating a tunable capacitive device 1000 according to an eighth exemplary embodiment of the present invention. In addition to the first tunable capacitive element 102, the second tunable capacitive element 104, the first coupling capacitive element 106, the second coupling capacitive element 108, the first coupling resistive element 110, the second coupling resistive element 112, the first specific capacitive element 202 and the second specific capacitive element 204 as shown in FIG. 2, the exemplary tunable capacitive device 1000 includes a third tunable capacitive element 1002, a fourth tunable capacitive element 1004, a third coupling resistive element 1006 and a fourth coupling resistive element 1008, where the third tunable capacitive element 1002 has a first node N31 and a second node N32 respectively coupled to the first voltage input terminal NV_1 and the first node N17 of the first specific capacitive element 202, the fourth tunable capacitive element 1004 has a first node N81 and a second node N82 respectively coupled to the first voltage input terminal NV_1 and the first node N27 of the second specific capacitive element 204, the third coupling resistive element 1006 has a first node N33 and a second node N34 respectively coupled to the second node N32 of the third tunable capacitive element 1002 and a third voltage input terminal NV_3 configured to receive a third input voltage $V_3$, and the fourth coupling resistive element 1008 has a first node N83 and a second node N84 respectively coupled to the second node N82 of the fourth tunable capacitive element 1004 and the third voltage input terminal NV_3.

In one exemplary design, the first input voltage $V_1$ is configured to be a tunable control voltage configured for tuning a capacitive value (capacitance value) of the tunable capacitive device 1000, and the second input voltage $V_2$ and the third input voltage $V_3$ are configured to be fixed reference voltages; in another exemplary design, the first input voltage $V_1$ is configured to be the fixed reference voltage, and the second input voltage $V_2$ and the third input voltage $V_3$ are configured to be tunable control voltages. Besides, the setting of the first input voltage $V_1$, the second input voltage $V_2$, and the third input voltage $V_3$ depends on actual design requirements.

Figure 10:
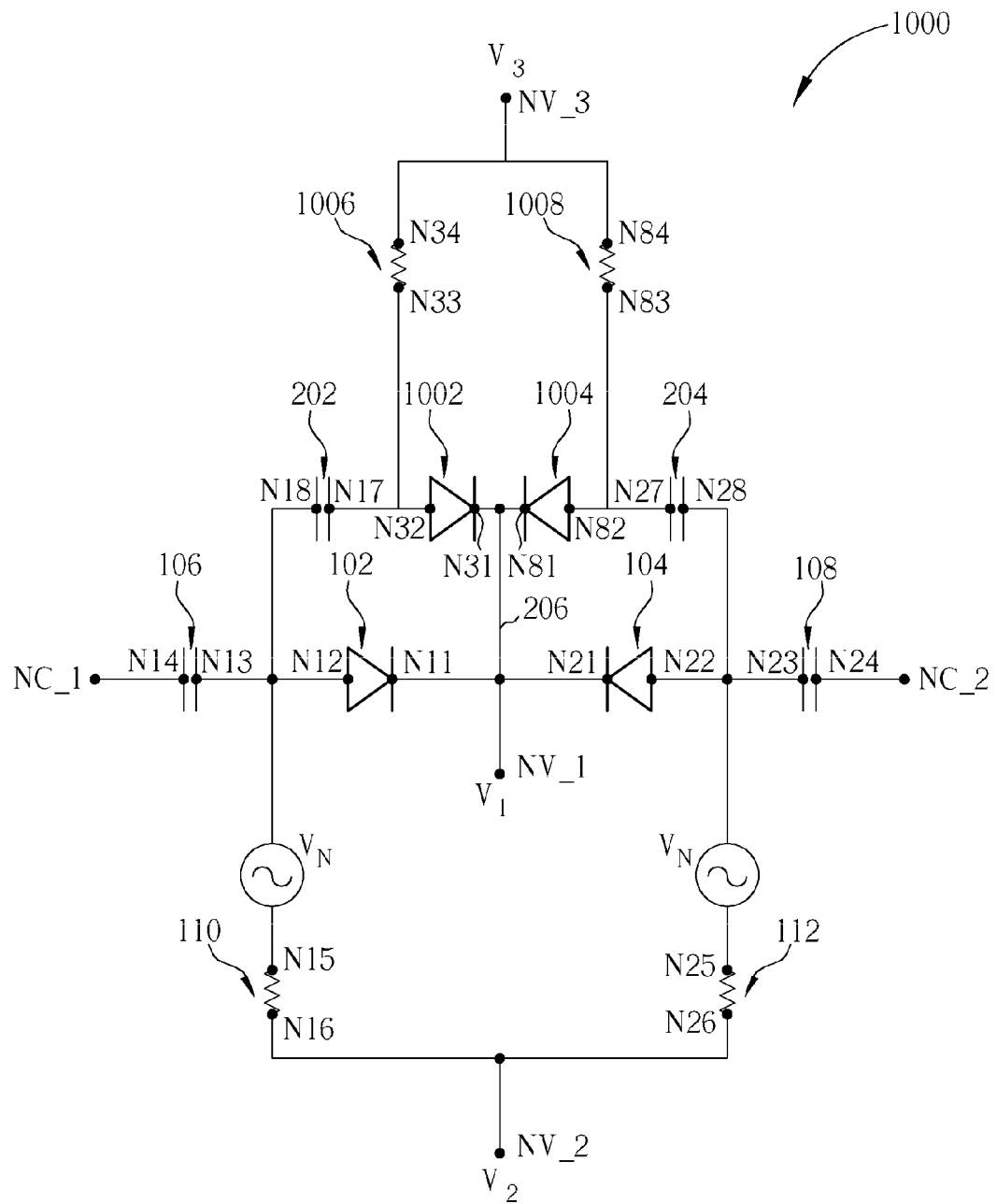
FIG. 10 is a diagram illustrating a tunable capacitive device according to an eighth exemplary embodiment of the present invention.
Figure 11:
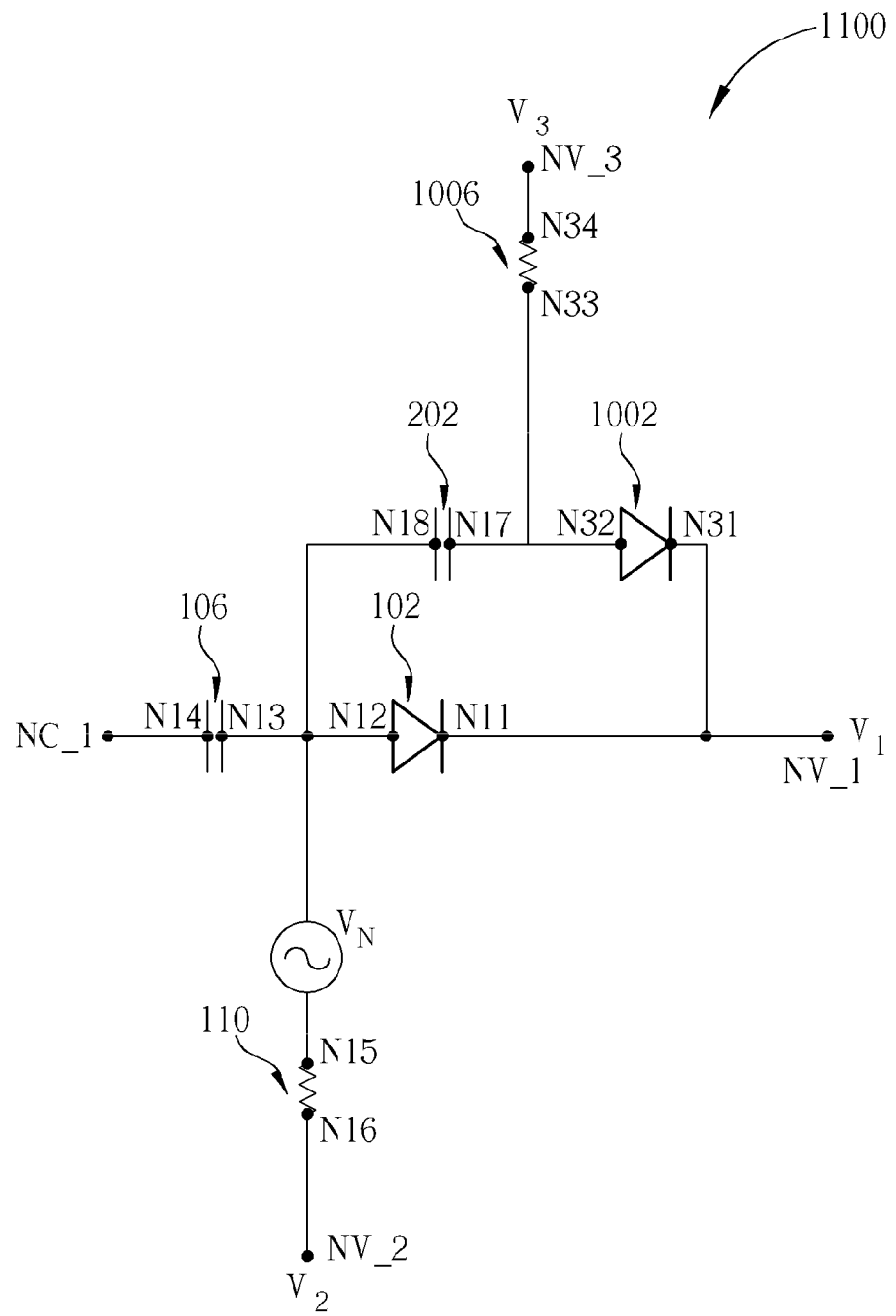
FIG. 11 is a diagram illustrating a tunable capacitive device according to a ninth exemplary embodiment of the present invention.

The exemplary tunable capacitive device 1000 shown in FIG. 10 is implemented using a differential topology to meet the requirements of a differential application. However, the tunable capacitive device can also be implemented using a single-ended topology to meet the requirements of a single-ended application. Please refer to FIG. 11, which is a diagram illustrating a tunable capacitive device 1100 according to a ninth exemplary embodiment of the present invention. In such an alternative design shown in FIG. 11, the second tunable capacitive element 104, the second coupling capacitive element 108, the second coupling resistive element 112, the second specific capacitive element 204, the fourth tunable capacitive element 1004, and the fourth coupling resistive element 1008 as shown in FIG. 10 are omitted.

Figure 12:
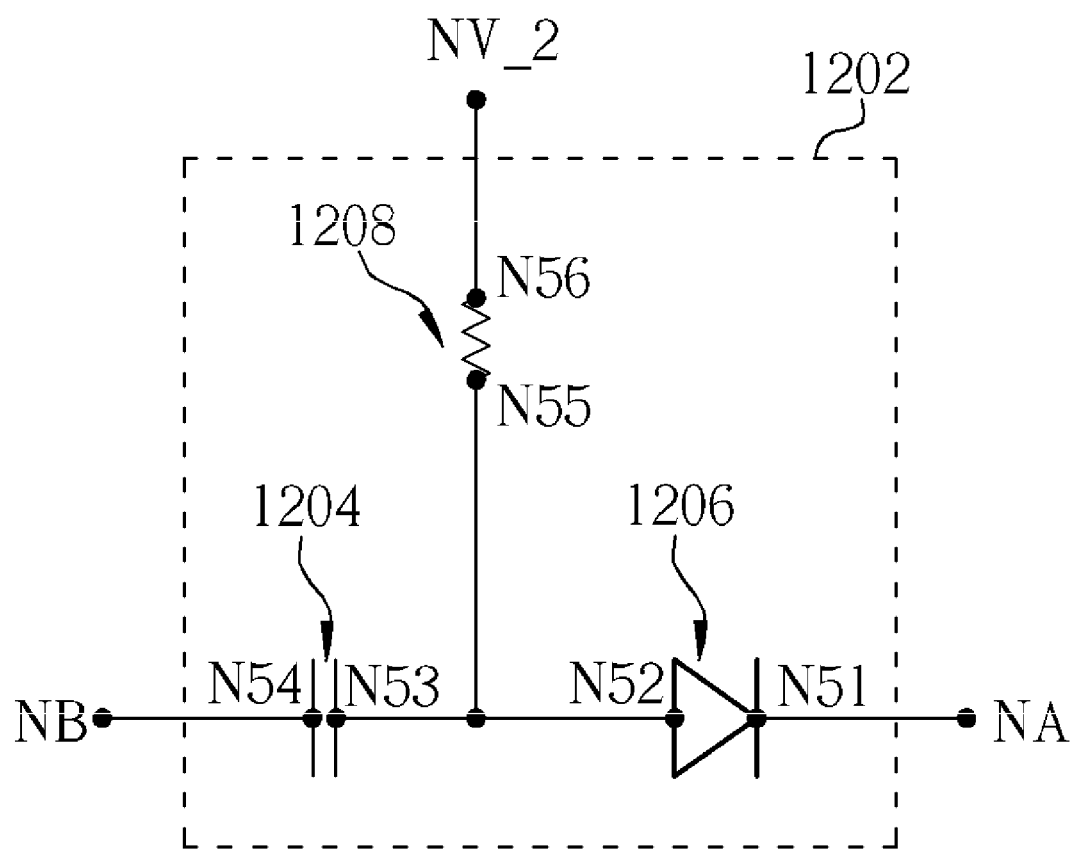
FIG. 12 is a diagram illustrating an alternative design of a particularly added capacitive element.

In above exemplary embodiments, the particularly added capacitive elements (i.e., 202, 204, 502, 602, 604, and 902) are simply implemented using capacitors, respectively; however, it should be noted that any circuit component with capacitive characteristic can be employed to realize the particularly added capacitive element. FIG. 12 is a diagram illustrating an alternative design of a particularly added capacitive element. As shown in FIG. 12, a replica circuit 1202 which includes a specific coupling capacitive element 1204, a specific tunable capacitive element 1206, and a specific coupling resistive element 1208 may be used to realize a capacitive element. The specific tunable capacitive element 1206 has a first node N51 coupled to a first connection terminal NA of the replica circuit 1202, and a second node N52; the specific coupling capacitive element 1204 has a first node N53 coupled to the second node N52 of the specific tunable capacitive element 1206, and a second node N54 coupled to a second connection terminal NB of the replica circuit 1202; and the specific coupling resistive element 1208 has a first node N55 coupled to the second node N52 of the specific tunable capacitive element 1206, and a second node N56 coupled to the second voltage input terminal NV_2. Taking the tunable capacitive devices 200 and 300 for example, the first specific capacitive element 202 and/or the second specific capacitive element 204 can be implemented using the replica circuit 1202. With regard to the first specific capacitive element 202, the second connection terminal NB of the replica circuit 1202 is coupled to the second node N12 of the first tunable capacitive element 102, and the first connection terminal NA of the replica circuit 1202 is coupled to the first node N11 of the first tunable capacitive element 102. By way of example, but not limitation, the specific coupling capacitive element 1204 is a replica of the first coupling capacitive element 106, the specific tunable capacitive element 1206 is a replica of the first tunable capacitive element 102, and the specific coupling resistive element 1208 is a replica of the first coupling resistive element 110. As a person skilled in the art can readily understand how to implement the second specific capacitive element 204 using the replica circuit 1202 after reading above description, further description is omitted here for brevity.

Please note that the tunable capacitive element included in aforementioned exemplary tunable capacitive devices 200, 300, 500, 600, 700, 900, 1000, and 1100 is shown implemented using a diode. BY way of example, but no limitation, a varactor diode is a two-terminal electronic component designed to provide a variable capacitance which is a function of voltages imposed on its terminals. Specifically, a varactor diode is designed to provide a voltage-controlled capacitance when operated in a reverse bias condition. However, realizing a tunable capacitive element by a diode with specific polarity, as shown in figures of the embodiments, is for illustrative purposes only, and is not meant to be a limitation to the scope of the present invention. In an alternative design, a tunable capacitive element shown in figures of the embodiments can be implemented using a metal-oxide semiconductor (MOS) transistor with its source and drain coupled to each other or any electronic component having a tunable capacitance value (e.g., a voltage-controlled capacitance value), depending upon actual design requirements.

In one implementation, the afore-mentioned tunable capacitive device can be used in a VCO to linearizing the C-F characteristic. However, it should be noted that the afore-mentioned tunable capacitive device is not limited to the VCO-based application (e.g., the VCO-based modulator). Any application which demands a tunable capacitive value can employ one or more of the exemplary tunable capacitive devices mentioned above.

Those skilled in the art will readily observe that numerous modifications and alterations of the device and method may be made while retaining the teachings of the invention.

What is claimed is:
1. A tunable capacitive device, comprising:
a first tunable capacitive element, having a first node and a second node, wherein the first node of the first tunable capacitive element is coupled to a first voltage input terminal configured to receive a first input voltage;

a first coupling capacitive element, having a first node and a second node, wherein the first node of the first coupling capacitive element is coupled to the second node of the first tunable capacitive element, and the second node of the first coupling capacitive element is coupled to a first connection terminal of the tunable capacitive device;

a first coupling resistive element, having a first node and a second node, wherein the first node of the first coupling resistive element is coupled to the second node of the first tunable capacitive element, the second node of the first coupling resistive element is coupled to a second voltage input terminal configured to receive a second input voltage, one of the first input voltage and the second input voltage is a control voltage configured for tuning a capacitive value of the tunable capacitive device, and the other of the first input voltage and the second input voltage is a reference voltage; and a first specific capacitive element, coupled between the first node and the second node of the first tunable capacitive element, wherein the first specific capacitive element has one node directly connected to at least one of the first tunable capacitive element and the first coupling capacitive element.

2. The tunable capacitive device of claim 1, further comprising:

a second tunable capacitive element, having a first node and a second node, wherein the first node of the second tunable capacitive element is coupled to the first voltage input terminal, and the second node of the second tunable capacitive element is coupled to the first specific capacitive element; and a second coupling resistive element, having a first node and a second node, wherein the first node of the second coupling resistive element is coupled to the second node of the second tunable capacitive element, the second node of the second coupling resistive element is coupled to a third voltage input terminal configured to receive a third input voltage, and the second input voltage and the third input voltage are control voltages or reference voltages.

3. The tunable capacitive device of claim 1, further comprising:

a second tunable capacitive element, having a first node and a second node, wherein the first node of the second tunable capacitive element is coupled to the first voltage input terminal;

a second coupling capacitive element, having a first node and a second node, wherein the first node of the second coupling capacitive element is coupled to the second node of the second tunable capacitive element, and the second node of the second coupling capacitive element is coupled to a second connection terminal of the tunable capacitive device;

a second coupling resistive element, having a first node and a second node, wherein the first node of the second coupling resistive element is coupled to the second node of the second tunable capacitive element, and the second node of the second coupling resistive element is coupled to the second voltage input terminal; and a second specific capacitive element, coupled between the first node and the second node of the second tunable capacitive element.

4. A tunable capacitive device, comprising:

a first tunable capacitive element, having a first node and a second node, wherein the first node of the first tunable capacitive element is coupled to a first voltage input terminal configured to receive a first input voltage;

a first coupling capacitive element, having a first node and a second node, wherein the first node of the first coupling capacitive element is coupled to the second node of the first tunable capacitive element, and the second node of the first coupling capacitive element is coupled to a first connection terminal of the tunable capacitive device;

a first coupling resistive element, having a first node and a second node, wherein the first node of the first coupling resistive element is coupled to the second node of the first tunable capacitive element, the second node of the first coupling resistive element is coupled to a second voltage input terminal configured to receive a second input voltage, one of the first input voltage and the second input voltage is a control voltage configured for tuning a capacitive value of the tunable capacitive device, and the other of the first input voltage and the second input voltage is a reference voltage;

a first specific capacitive element, coupled between the first node and the second node of the first tunable capacitive element;

a second tunable capacitive element, having a first node and a second node, wherein the first node of the second tunable capacitive element is coupled to the first voltage input terminal;

a second coupling capacitive element, having a first node and a second node, wherein the first node of the second coupling capacitive element is coupled to the second node of the second tunable capacitive element, and the second node of the second coupling capacitive element is coupled to a second connection terminal of the tunable capacitive device;

a second coupling resistive element, having a first node and a second node, wherein the first node of the second coupling resistive element is coupled to the second node of the second tunable capacitive element, and the second node of the second coupling resistive element is coupled to the second voltage input terminal;

a second specific capacitive element, coupled between the first node and the second node of the second tunable capacitive element;

a third tunable capacitive element, having a first node and a second node, wherein the first node of the third tunable capacitive element is coupled to the first voltage input terminal, and the second node of the third tunable capacitive element is coupled to the first specific capacitive element;

a fourth tunable capacitive element, having a first node and a second node, wherein the first node of the fourth tunable capacitive element is coupled to the first voltage input terminal, and the second node of the fourth tunable capacitive element is coupled to the second specific capacitive element;

a third coupling resistive element, having a first node and a second node, wherein the first node of the third coupling resistive element is coupled to the second node of the third tunable capacitive element, the second node of the third coupling resistive element is coupled to a third voltage input terminal configured to receive a third input voltage, and the second input voltage and the third input voltage are control voltages or reference voltages; and a fourth coupling resistive element, having a first node and a second node, wherein the first node of the fourth coupling resistive element is coupled to the second node of the fourth tunable capacitive element, and the second node of the fourth coupling resistive element is coupled to the third voltage input terminal.

5. A tunable capacitive device, comprising:
a first tunable capacitive element, having a first node and a second node, wherein the first node of the first tunable capacitive element is coupled to a first voltage input terminal configured to receive a first input voltage;
a first coupling capacitive element, having a first node and a second node, wherein the first node of the first coupling capacitive element is coupled to the second node of the first tunable capacitive element, and the second node of the first coupling capacitive element is coupled to a first connection terminal of the tunable capacitive device;
a first coupling resistive element, having a first node and a second node, wherein the first node of the first coupling resistive element is coupled to the second node of the first tunable capacitive element, the second node of the first coupling resistive element is coupled to a second voltage input terminal configured to receive a second input voltage, one of the first input voltage and the second input voltage is a control voltage configured for tuning a capacitive value of the tunable capacitive device, and the other of the first input voltage and the second input voltage is a reference voltage; and
a first specific capacitive element, coupled between the first node and the second node of the first tunable capacitive element;
wherein the first specific capacitive element comprises:
a specific tunable capacitive element, having a first node and a second node, wherein the first node of the specific tunable capacitive element is coupled to the first voltage input terminal;
a specific coupling capacitive element, coupled between the second node of the specific tunable capacitive element and the second node of the first tunable capacitive element; and
a specific coupling resistive element, coupled between the second node of the specific tunable capacitive element and the second voltage input terminal.

6. The tunable capacitive device of claim 5, wherein the specific tunable capacitive element is a replica of the first tunable capacitive element, the specific coupling capacitive element is a replica of the first coupling capacitive element, and the specific coupling resistive element is a replica of the first coupling resistive element.

7. The tunable capacitive device of claim 1, wherein the first tunable capacitive element is implemented by a metal-oxide semiconductor (MOS) transistor or a diode.

8. A tunable capacitive device, comprising:
a first tunable capacitive element, having a first node and a second node, wherein the first node of the first tunable capacitive element is coupled to a first voltage input terminal configured to receive a first input voltage;
a second tunable capacitive element, having a first node and a second node, wherein the first node of the second tunable capacitive element is coupled to the first voltage input terminal;
a first coupling capacitive element, having a first node and a second node, wherein the first node of the first coupling capacitive element is coupled to the second node of the first tunable capacitive element, and the second node of the first coupling capacitive element is coupled to a first connection terminal of the tunable capacitive device;
a second coupling capacitive element, having a first node and a second node, wherein the first node of the second coupling capacitive element is coupled to the second node of the second tunable capacitive element, and the second node of the second coupling capacitive element is coupled to a second connection terminal of the tunable capacitive device;
a first coupling resistive element, having a first node and a second node, wherein the first node of the first coupling resistive element is coupled to the second node of the first tunable capacitive element, and the second node of the first coupling resistive element is coupled to a second voltage input terminal configured to receive a second input voltage;
a second coupling resistive element, having a first node and a second node, wherein the first node of the second coupling resistive element is coupled to the second node of the second tunable capacitive element, the second node of the second coupling resistive element is coupled to the second voltage input terminal, one of the first input voltage and the second input voltage is a control voltage configured for tuning a capacitive value of the tunable capacitive device, and the other of the first input voltage and the second input voltage is a reference voltage; and
a specific capacitive element, having a first node and a second node, wherein the first node of the specific capacitive element is directly connected to the second node of the first coupling capacitive element, and the second node of the specific capacitive element is directly connected to the second node of the second coupling capacitive element.

9. The tunable capacitive device of claim 8, wherein each of the first tunable capacitive element and the second tunable capacitive element is implemented by a metal-oxide semiconductor (MOS) transistor or a diode.

10. The tunable capacitive device of claim 2, wherein the first specific capacitive element has one node directly connected to one of the second tunable capacitive element and the second coupling resistive element.

11. The tunable capacitive device of claim 3, wherein the second specific capacitive element has one node directly connected to at least one of the second tunable capacitive element and the second coupling capacitive element.

12. The tunable capacitive device of claim 4, wherein the first specific capacitive element has one node directly connected to at least one of the first tunable capacitive element and the first coupling capacitive element.

13. The tunable capacitive device of claim 4, wherein the second specific capacitive element has one node directly connected to at least one of the second tunable capacitive element and the second coupling capacitive element.

14. The tunable capacitive device of claim 4, wherein the first specific capacitive element has one node directly connected to at least one of the third tunable capacitive element and the third coupling resistive element.

15. The tunable capacitive device of claim 4, wherein the second specific capacitive element has one node directly connected to at least one of the fourth tunable capacitive element and the fourth coupling resistive element.

16. The tunable capacitive device of claim 5, wherein the first specific capacitive element has one node directly connected to at least one of the first tunable capacitive element and the first coupling capacitive element.

17. The tunable capacitive device of claim 5, wherein the specific coupling capacitive element has one node directly connected to at least one of the specific tunable capacitive element and the specific coupling resistive element.

* * * * *